United States Patent
Yamaguchi et al.

(10) Patent No.: US 12,074,428 B2
(45) Date of Patent: Aug. 27, 2024

(54) CURRENT DETECTING DEVICE AND POWER SUPPLY DEVICE

(71) Applicant: YAZAKI CORPORATION, Tokyo (JP)

(72) Inventors: Hayato Yamaguchi, Makinohara (JP); Sadaharu Okuda, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 66 days.

(21) Appl. No.: 17/837,029

(22) Filed: Jun. 10, 2022

(65) Prior Publication Data

US 2022/0399715 A1    Dec. 15, 2022

(30) Foreign Application Priority Data

Jun. 11, 2021    (JP) .................................. 2021-098243

(51) Int. Cl.
*H02H 5/04* (2006.01)
*G01R 19/25* (2006.01)
*H02H 1/00* (2006.01)
*H02H 3/087* (2006.01)

(52) U.S. Cl.
CPC ......... *H02H 5/047* (2013.01); *G01R 19/2513* (2013.01); *H02H 1/0007* (2013.01); *H02H 3/087* (2013.01)

(58) Field of Classification Search
CPC ............................... H02H 5/041; H02H 5/047
See application file for complete search history.

(56) References Cited

U.S. PATENT DOCUMENTS

| | | |
|---|---|---|
| 5,061,863 A | 10/1991 | Mori et al. |
| 2006/0244433 A1* | 11/2006 | Nakahara ............... G01R 31/30 324/76.11 |
| 2008/0018324 A1 | 1/2008 | Nakahara |
| 2016/0233856 A1 | 8/2016 | Wasekura |
| 2017/0294773 A1 | 10/2017 | Illing et al. |
| 2018/0287365 A1 | 10/2018 | Djelassi-Tscheck et al. |
| 2019/0260200 A1* | 8/2019 | Sawano ................. H02H 3/087 |

FOREIGN PATENT DOCUMENTS

| | | |
|---|---|---|
| EP | 2747285 A1 | 6/2014 |
| JP | H3-129849 A | 6/1991 |
| JP | 2001-197723 A | 7/2001 |
| JP | 2004-330927 A | 11/2004 |
| JP | 2012-138835 A | 7/2012 |
| JP | 2015-89051 A | 5/2015 |
| JP | 2016-80396 A | 5/2016 |
| JP | 2017-63265 A | 3/2017 |
| WO | 2004/053507 A1 | 6/2004 |
| WO | 2017/122781 A1 | 7/2017 |

* cited by examiner

*Primary Examiner* — Jared Fureman
*Assistant Examiner* — Christopher J Clark
(74) *Attorney, Agent, or Firm* — KENEALY VAIDYA LLP

(57) ABSTRACT

A current detecting device includes a sense resistor through which a sense current corresponding to a consumption current supplied to a load flows, and an A/D converter configured to perform A/D conversion on a voltage drop generated by the sense current flowing through the sense resistor to detect the consumption current. A resistance value of the sense resistor is variably provided.

7 Claims, 4 Drawing Sheets

CURRENT DETECTING DEVICE AND POWER SUPPLY DEVICE

CROSS-REFERENCE TO RELATED APPLICATIONS

This application is based on and claims priority under 35 U.S.C. 119 from Japanese Patent Application No. 2021-098243 filed on Jun. 11, 2021, the contents of which are incorporated herein by reference.

TECHNICAL FIELD

The present disclosure relates to a current detecting device and a power supply device.

BACKGROUND ART

In related art, a current detecting device that detects a consumption current supplied from a battery mounted on a vehicle to a load has been known. As the current detecting device, a sense current corresponding to the consumption current flows through a sense resistor, and a voltage drop generated in the sense resistor is subjected to A/D conversion to detect a voltage.

In recent years, in order to cope with CASE (Connected, Autonomous, Shared & Services, Electric) and Maas (Mobility as a Service), specifications of vehicles have increased, and types of loads mounted on vehicles have increased. For example, even with the same lamp load, there are an illumination lamp having a consumption current of 0.5 A and an external lamp having a consumption current of 1.0 A. For this reason, in order to be able to detect currents of both the illumination lamp having the consumption current of 0.5 A and the external lamp having the consumption current of 1.0 A, it is necessary to use an A/D converter having a wide dynamic range.

However, when the A/D converter having the wide dynamic range is used, a current detecting accuracy decreases in a case that the consumption current is small. Therefore, in the related art, the A/D converter having a dynamic range corresponding to the consumption current of the load is used. However, in this case, types of the current detecting devices may increase.

In addition, it is considered that a resistor used in an on and off detecting circuit that detects on and off of a contact switch is variable (JP-A-2012-138835). However, in JP-A-2012-138835, a variable resistor is not a resistor that detects a current flowing through a load.

The present disclosure has been made in view of the above circumstances, and an object thereof is to provide a current detecting device and a power supply device capable of reducing the types of parts.

SUMMARY OF INVENTION

In order to achieve the above object, a current detecting device and a power supply device according to the present disclosure are characterized as follows.

According to an aspect of the present disclosure, there is provided a current detecting device including: a sense resistor through which a sense current corresponding to a consumption current supplied to a load flows, and an A/D converter configured to perform A/D conversion on a voltage drop generated by the sense current flowing through the sense resistor to detect the consumption current, in which a resistance value of the sense resistor is variably provided.

Also, according to an another aspect of the present disclosure, there is provided a power supply device including: the current detecting device, a semiconductor switch element configured to turn on and off the consumption current supplied to the load, an overheat detecting unit configured to detect overheat of an electric wire through which the consumption current flows based on the consumption current detected by the A/D converter, and a switch control unit configured to turn off the semiconductor switch element in a case where the overheat detecting unit detects the overheat.

The present disclosure can provide a current detecting device and a power supply device capable of reducing the types of parts.

The present disclosure has been briefly described above. Details of the present disclosure will be further clarified by reading a mode for carrying out the present disclosure described below (hereinafter, referred to as "embodiment") with reference to the accompanying drawings.

DESCRIPTION OF EMBODIMENTS

A specific embodiment according to the present disclosure will be described below with reference to the accompanying drawings.

Figure 1:
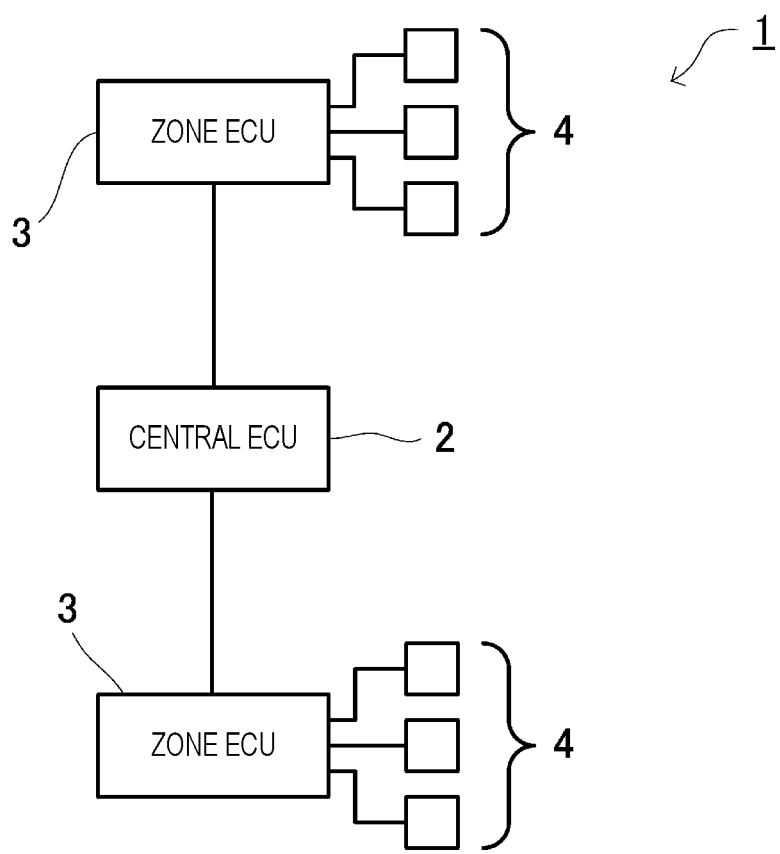
FIG. 1 is a block diagram showing an embodiment of a communication system incorporating a zone ECU as a power supply device according to the present embodiment.

FIG. 1 is a block diagram showing a communication system 1 incorporating a zone ECU as a power supply device according to the present embodiment. The communication system 1 according to the present embodiment is mounted on a vehicle. The communication system 1 includes a central electron control unit (ECU) 2, and zone ECUs 3 as a current detecting device and a power supply device.

The central ECU 2 includes a central processing unit (CPU) that operates according to a program, and is provided in, for example, an instrument panel of the vehicle. The central ECU 2 controls the entire communication system 1.

The zone ECU 3 is provided in each area of the vehicle such as left and right doors and a ceiling. The zone ECU 3 communicates with the central ECU 2 and controls power supply to a load 4 arranged in the area according to an instruction from the central ECU 2.

Figure 2:
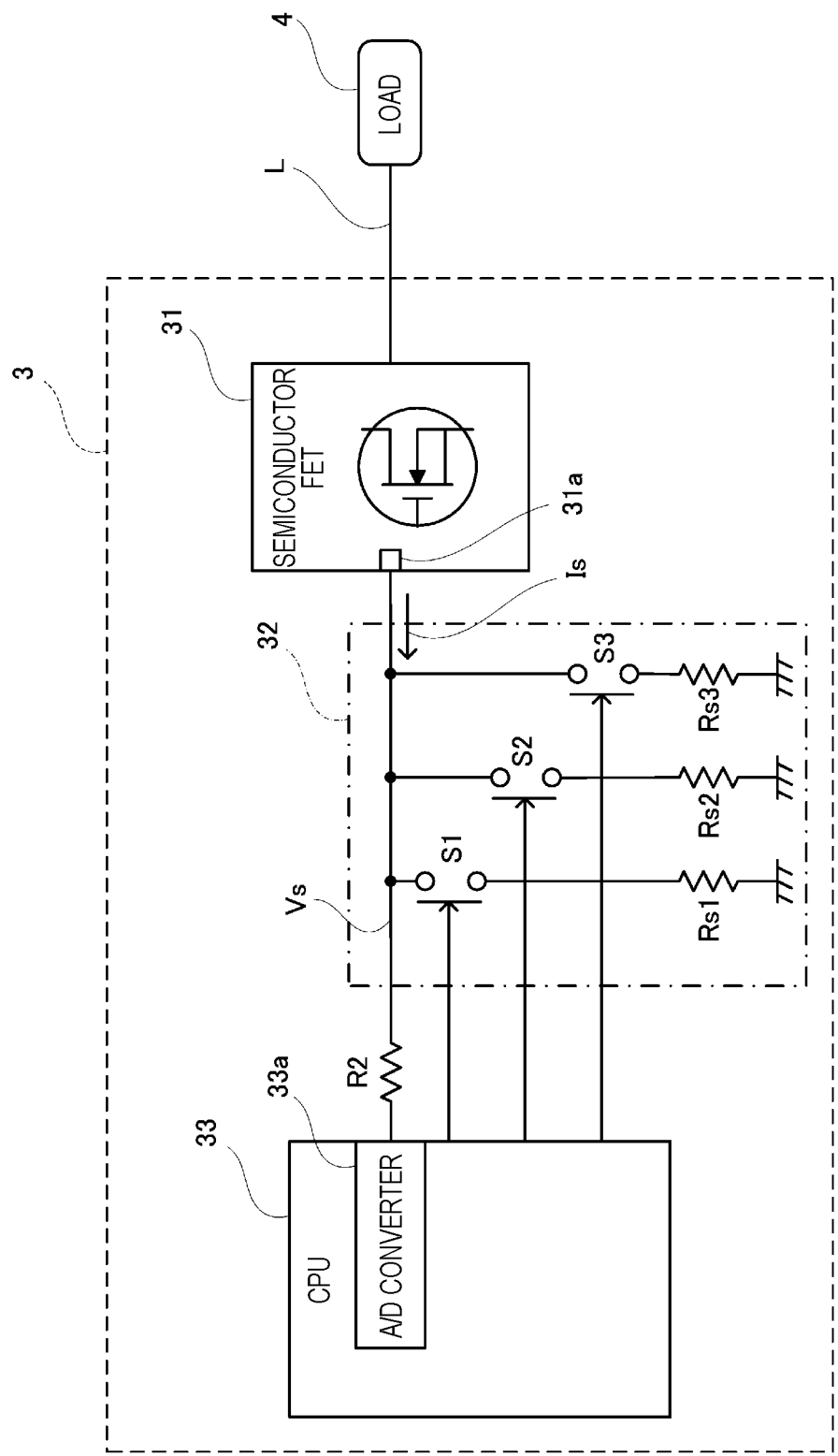
FIG. 2 is a circuit diagram showing a configuration of the zone ECU shown in FIG. 1.

As shown in FIG. 2, the zone ECU 3 includes a semiconductor field-effect transistor (FET) 31 as a semiconductor switch element that turns on and off a power supply supplied to the load 4, a sense resistor 32 through which a sense current Is corresponding to a consumption current supplied to the load 4 flows, and a CPU 33 in which an A/D converter 33a is built and that operates according to a program.

A power supply (not shown) and the load 4 are connected between a drain and a source of the semiconductor FET 31, and the semiconductor FET 31 turns on and off power supplied to the load 4. Although only one semiconductor FET 31 is provided in an example shown in FIG. 2, a plurality of semiconductor FETs 31 may be provided.

Figure 3:
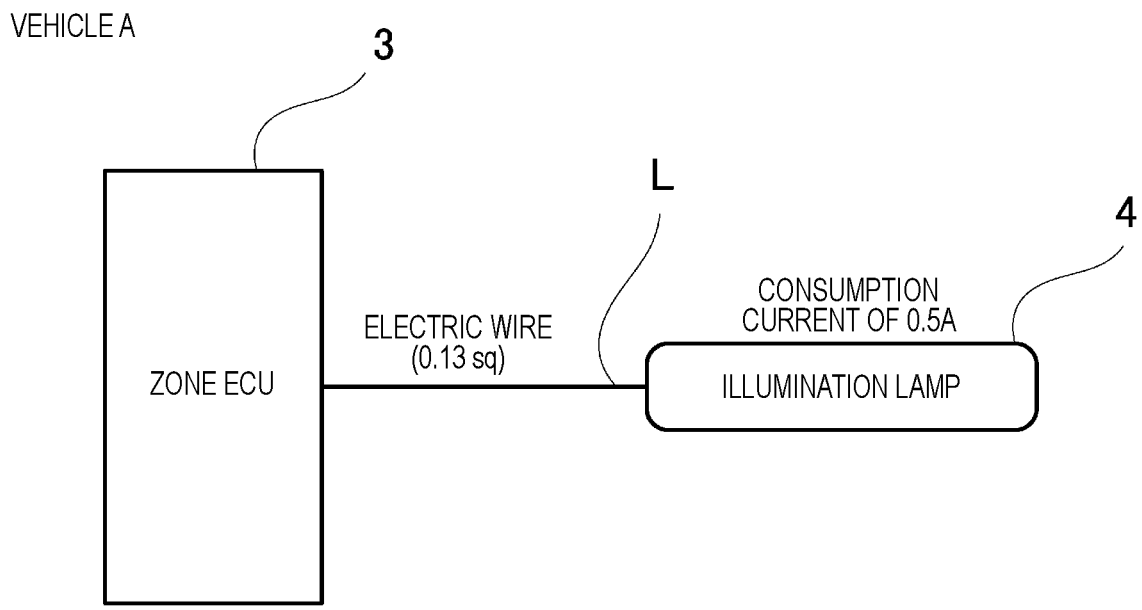
FIG. 3 is circuit diagrams each showing a load mounted on each of vehicles A, B and the zone ECU.
Figure 3:
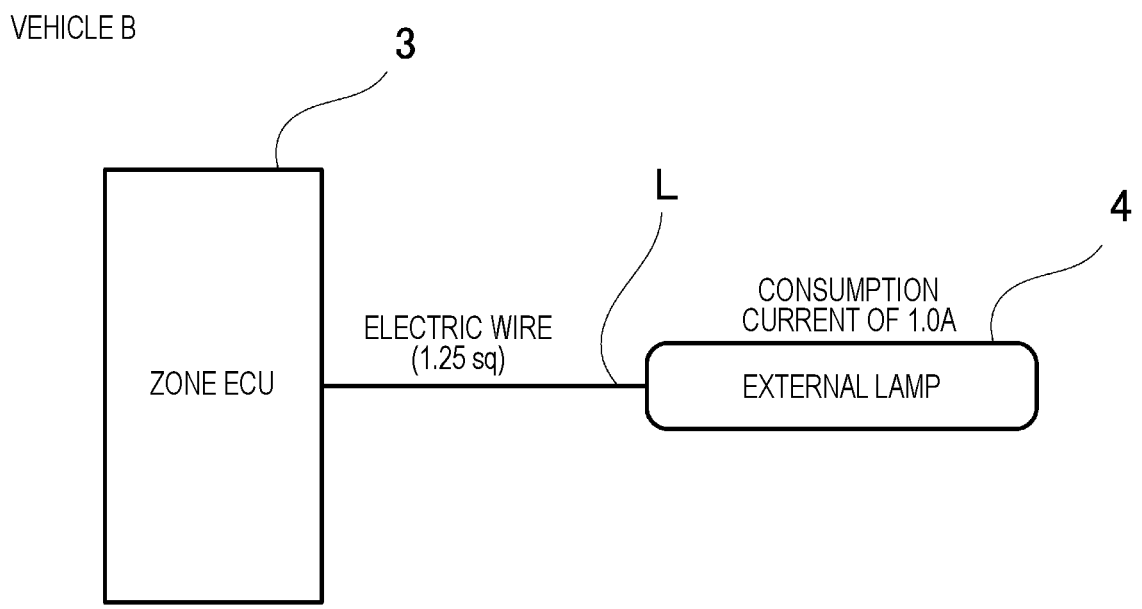

The load 4 having a different consumption current depending on a specification of the vehicle is connected to the semiconductor FET 31. As shown in FIG. 3, in a vehicle A, an illumination lamp having a consumption current of 0.5 A is connected to the semiconductor FET 31 as the load 4. In a vehicle B, an external lamp having a consumption current of 1.0 A is connected to the semiconductor FET 31 as the load 4. As an electric wire L connecting the semiconductor FET 31 and the load 4, an electric wire having a thickness corresponding to the consumption current supplied to the load 4 is connected. For example, when the illumination lamp having the consumption current of 0.5 A is connected as the load 4, the electric wire L having a small diameter of 0.13 sq (square mm) is connected. On the other hand, when the external lamp having the consumption current of 1.0 A is connected as the load 4, the electric wire L having a large diameter of 1.25 sq is connected.

The semiconductor FET 31 according to the present embodiment has a so-called current sensing function, and includes a built-in main FET (not shown) that supplies the power to the load 4 and a built-in sense FET (not shown) that detects the consumption current supplied to the load 4. A gate and a drain of the sense FET are commonly connected to a gate and a drain of the main FET, respectively, and a current corresponding to a current (=consumption current) flowing through the main FET flows as the sense current Is of the sense FET. As shown in FIG. 2, the semiconductor FET 31 is provided with a sense electrode 31a as an output terminal that outputs the sense current Is. The gate of the semiconductor FET 31 is connected to the CPU 33 that controls on and off of the semiconductor FET 31.

The sense resistor 32 is provided between the sense electrode 31a and the ground, and has a variable resistance value. In the present embodiment, the sense resistor 32 includes a plurality of resistors Rs1, Rs2, Rs3 connected in parallel, and switches S1, S2, S3 connected in series to the plurality of resistors Rs1, Rs2, Rs3, respectively, and connected in parallel to each other. The resistors Rs1, Rs2, Rs3 may have resistance values different from each other, or all or some of the resistors Rs1, Rs2, Rs3 may have the same resistance value.

One ends of the resistors Rs1, Rs2, Rs3 are connected to the ground, and the other ends of the resistors Rs1, Rs2, Rs3 are connected to the switches S1, S2, S3, respectively. One ends of the switches S1, S2, S3 are connected to the sense electrode 31a, and the other ends of the switches S1, S2, S3 are connected to the resistors Rs1, Rs2, Rs3, respectively. The resistance value of the sense resistor 32 can be changed by a combination of on and off of the switches S1, S2, S3. The switches S1, S2, S3 are connected to the CPU 33 that controls on and off of the switches S1, S2, S3.

A voltage drop (voltage) generated by the sense current Is flowing through the sense resistor 32 is input to the A/D converter 33a via a resistor R2 as consumption current information Vs. The A/D converter 33a performs A/D conversion on the consumption current information Vs to detect the consumption current.

Figure 4:
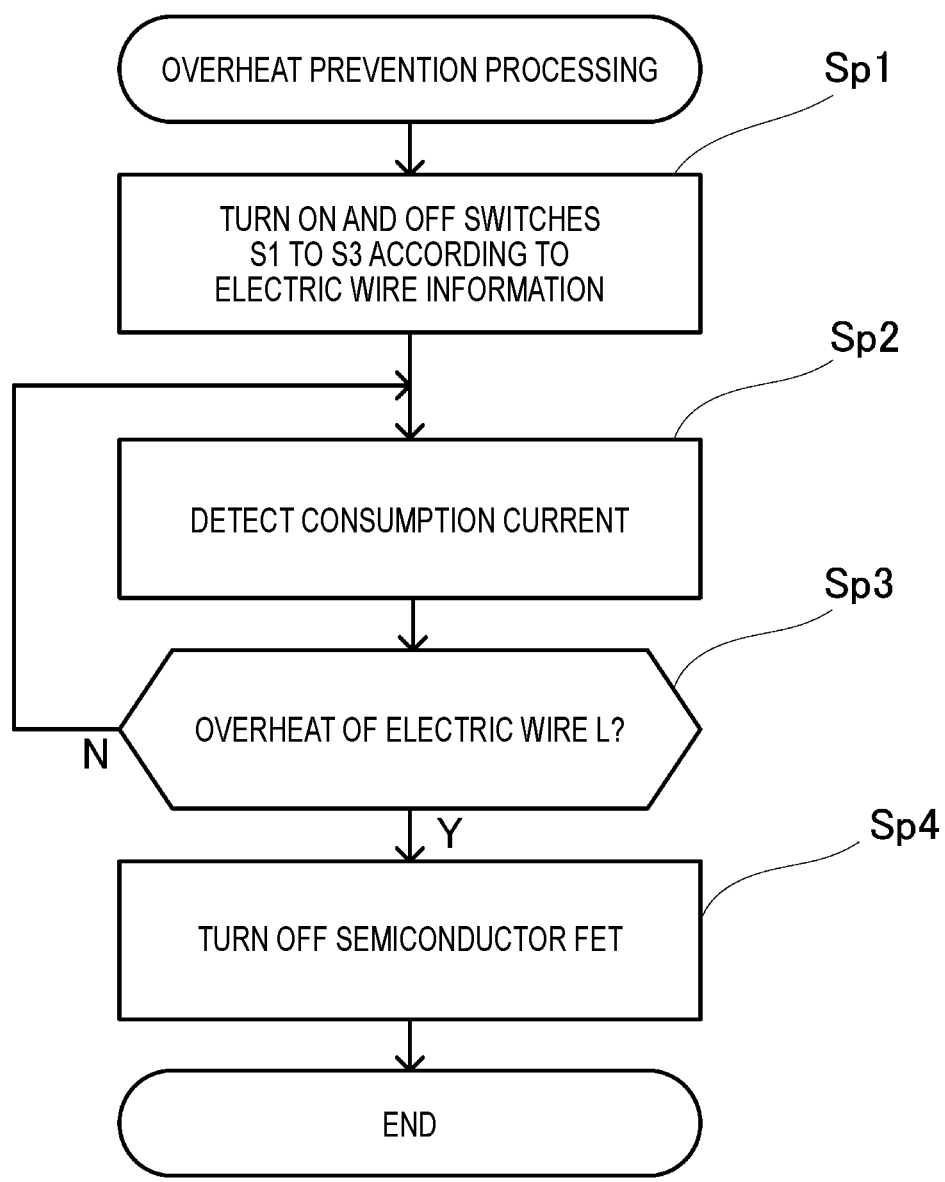
FIG. 4 is a flowchart showing an overheat prevention processing procedure executed by a CPU of the zone ECU shown in FIG. 2.

Next, an operation of the communication system 1 having the above-described configuration will be described. When an ignition switch is turned on, the CPU 33 of the zone ECU 3 starts communication with the central ECU 2, and controls on and off of the semiconductor FET 31 according to an instruction from the central ECU 2. In parallel with this, the zone ECU 3 executes overheat prevention processing shown in FIG. 4.

When the ignition switch is turned on, the CPU 33 reads electric wire information stored in a memory (not shown), and turns on and off the switches S1 to S3 according to the read electric wire information (Sp1). The electric wire information includes information on the thickness (size) of the electric wire L. Thereby, the resistance value can be set according to the thickness of the electric wire L, that is, the consumption current flowing through the electric wire L. Specifically, the CPU 33 turns on and off the switches S1 to S3 such that the combined resistance value of the sense resistor 32 decreases as the electric wire L becomes thick and the consumption current increases, and turns on and off the switches S1 to S3 such that the combined resistance value of the sense resistor 32 increases as the electric wire L becomes thin and the consumption current decreases.

Next, the CPU 33 takes in the consumption current information Vs converted by the A/D converter 33a and detects the consumption current (Sp2). Thereafter, the CPU 33 functions as an overheat detecting unit, calculates a heat generation amount of the electric wire L based on the detected consumption current, and detects overheat of the electric wire L (Sp3). When overheat is detected (Y in Sp3), the CPU 33 functions as a switch control unit, turns off the semiconductor FET 31 to cut off the consumption current flowing through the electric wire L (Sp4), and ends the processing. On the other hand, if overheat is not detected (N in Sp3), the CPU 33 returns to Sp2.

A reprogramming device (external device) (not shown) capable of rewriting programs and data stored in memories of the central ECU 2 and the zone ECU 3 is detachably connected to the communication system 1. The central ECU 2 communicates with the reprogramming device to rewrite its own program and data or instruct rewriting of the program and data of the zone ECU 3. The electric wire information stored in the zone ECU 3 described above can be rewritten by communication with the reprogramming device (outside). That is, the CPU 33 of the zone ECU 3 functions as a setting unit, and can set the resistance value of the sense resistor 32 as a resistance value according to the communication with the reprogramming device.

In the example described above, the zone ECU 3 communicates with the reprogramming device via the central ECU 2, but the zone ECU 3 and the reprogramming device may directly communicate with each other. The reprogramming device may be connected to the communication system 1 in a wired manner or in a wireless manner.

According to the embodiment described above, the resistance value of the sense resistor 32 is variably provided. Thereby, the sense resistor 32 can be set to a resistance value corresponding to the consumption current of the load 4, and the consumption current can be accurately detected even when the load 4 is replaced according to the specification or the like. That is, even when the illumination lamp having the consumption current of 0.5 A is connected as the load 4 or the external lamp having the consumption current of 1.0 A is connected as the load 4, a voltage range of the consumption current information Vs can be made substantially the same, and it is not necessary to change the A/D converter 33a of the zone ECU 3 for each load current. Therefore, the types of the zone ECUs 3 can be reduced. Development processes due to replacement of the load 4 can be reduced, and a cost of the zone ECU 3 due to a mass volume can be reduced.

According to the embodiment described above, the CPU 33 of the zone ECU 3 rewrites the electric wire information by communication with the reprogramming device, and sets the resistance value of the sense resistor 32 to a resistance value according to the communication. Thereby, the resistance value of the sense resistor 32 can be set by communication with the reprogramming device.

According to the embodiment described above, the sense resistor 32 includes the plurality of resistors Rs1, Rs2, Rs3 connected in parallel, and the switches S1, S2, S3 connected to the resistors Rs1, Rs2, Rs3, respectively. Thereby, the sense resistor 32 can be variably provided with a simple configuration.

According to the embodiment described above, the CPU 33 detects overheat of the electric wire L based on the consumption current detected by the A/D converter 33*a*, and turns off the semiconductor FET 31 when the overheat is detected. Thereby, overheat of the electric wire L can be prevented.

According to the embodiment described above, the semiconductor FET 31 includes the sense electrode 31*a* that outputs the sense current Is, and the sense current Is output from the sense electrode 31*a* flows through the sense resistor 32. Thereby, the sense current Is can flow through the sense resistor 32 with a simple configuration.

The present disclosure is not limited to the embodiment described above, and modifications, improvements, and the like can be made as appropriate. In addition, materials, shapes, dimensions, numbers, arrangement positions, and the like of components in the embodiment described above are optional and are not limited as long as the present disclosure can be achieved.

According to the embodiment described above, the CPU 33 is provided so as to be able to rewrite the electric wire information according to the communication with the reprogramming device, and sets the resistance value of the sense resistor 32 according to the rewritten electric wire information, but the present disclosure is not limited thereto. For example, an operation switch may be provided in the zone ECU 3, and the CPU 33 may set the resistance value of the sense resistor 32 according to on and off information of the operation switch.

According to the embodiment described above, the semiconductor FET 31 having the current sensing function is used, but the present disclosure is not limited thereto. A circuit for dividing the consumption current flowing through the electric wire L may be provided, and the sense current Is flowing through the dividing circuit may flow through the sense resistor 32.

Here, features of embodiments of the current detecting device and the power supply device according to the present disclosure described above will be briefly summarized and listed in [1] to [5] below.

[1] A current detecting device (3) including:
a sense resistor (32) through which a sense current (Is) corresponding to a consumption current supplied to a load (4) flows; and
an A/D converter (33*a*) configured to perform A/D conversion on a voltage drop generated by the sense current (Is) flowing through the sense resistor (32) to detect the consumption current,
in which a resistance value of the sense resistor (32) is variably provided.

[2] The current detecting device (3) according to [1], further including:
a setting unit (33) configured to set a resistance value of the sense resistor (32) to a resistance value according to communication with an external device.

[3] The current detecting device (3) according to [1] or [2],
in which the sense resistor (32) includes a plurality of resistors (Rs1 to Rs3) connected in parallel, and switches (S1 to S3) connected in series to the plurality of resistors (Rs1 to Rs3), respectively, and connected in parallel to each other.

[4] A power supply device (3) including:
the current detecting device (3) according to any one of [1] to [3];
a semiconductor switch element (31) configured to turn on and off the consumption current supplied to the load (4);
an overheat detecting unit (33) configured to detect overheat of an electric wire through which the consumption current flows based on the consumption current detected by the A/D converter (33*a*); and
a switch control unit (33) configured to turn off the semiconductor switch element (31) in a case where the overheat detecting unit (33) detects the overheat.

[5] The power supply device (3) according to [4],
in which the semiconductor switch element (31) has an output terminal (31*a*) that outputs the sense current (Is), and
in which the sense current (Is) output from the output terminal (31*a*) flows through the sense resistor (32).

According to the current detecting device having a configuration of [1], the resistance value of the sense resistor is variably provided. Thereby, the resistance value of the sense resistor can be set according to the consumption current of the load, and even if the load is changed, a voltage drop range of the sense resistor can be made substantially the same, and it is not necessary to change the A/D converter for each load current, and the types of parts can be reduced.

According to the current detecting device having a configuration of [2], the resistance value of the sense resistor can be set according to the communication with the external device. Thereby, the resistance value of the sense resistor can be easily changed according to the consumption current.

According to the current detecting device having a configuration of [3], the resistance value of the sense resistor can be variably provided with a simple configuration.

According to the power supply device having a configuration of [4], overheat of the electric wire can be prevented.

According to the power supply device having a configuration of [5], the sense current corresponding to the consumption current can flow through the sense resistor with a simple configuration.

What is claimed is:

1. A current detecting device comprising:
a sense resistor through which a sense current corresponding to a consumption current supplied to a load flows;
a setting unit connected to the sense resistor; and
an A/D converter configured to perform A/D conversion on a voltage drop generated by the sense current flowing through the sense resistor to detect the consumption current,
wherein a resistance value of the sense resistor is variably provided, and
the setting unit configured to set a resistance value of the sense resistor to a resistance value according to a wire thickness.

2. The current detecting device according to claim 1, wherein the setting unit is configured to set the resistance value of the sense resistor to a resistance value according to communication with an external device.

3. The current detecting device according to claim 1, wherein the sense resistor includes:
a plurality of resistors connected in parallel, and switches connected in series to the plurality of resistors, respectively, and connected in parallel to each other.

4. A power supply device comprising:

the current detecting device according to claim 1;

a semiconductor switch element configured to turn on and off the consumption current supplied to the load;

an overheat detecting unit configured to detect overheat of an electric wire through which the consumption current flows based on the consumption current detected by the A/D converter; and a switch control unit configured to turn off the semiconductor switch element in a case where the overheat detecting unit detects the overheat.

5. The power supply device according to claim 4, wherein the semiconductor switch element has an output terminal that outputs the sense current, and wherein the sense current output from the output terminal flows through the sense resistor.

6. The current detecting device according to claim 1, wherein the setting unit is configured to read electrical wire information stored in a memory and to set the resistance value of the sense resistor according to the read electric wire information, the electric wire information includes information on the wire thickness.

7. The current detecting device according to claim 6, the electrical wire information stored in the memory can be rewritten by communication with an external reprograming device.

* * * * *